United States Patent [19]
Kronberg

[11] Patent Number: 5,204,671
[45] Date of Patent: Apr. 20, 1993

[54] RANDOM ONE-OF-N SELECTOR

[76] Inventor: James W. Kronberg, 353 Church Rd., Beech Island, S.C. 29841

[21] Appl. No.: 643,305

[22] Filed: Jan. 22, 1991

[51] Int. Cl.$^5$ ............................................. H04B 1/00
[52] U.S. Cl. .......................... 340/825.650; 273/138 A
[58] Field of Search ........... 340/146.2, 825.65, 825.30; 273/138 A; 235/375; 377/49

[56] References Cited

U.S. PATENT DOCUMENTS

| | | | |
|---|---|---|---|
| 3,580,581 | 3/1971 | Raven | 273/138 A |
| 3,799,553 | 3/1974 | Hurley | 273/138 A |
| 3,834,710 | 9/1974 | Sousan | 273/138 A |
| 3,961,169 | 6/1976 | Bishop et al. | 364/717 |
| 4,580,226 | 4/1986 | Bennison | 364/552 |
| 4,811,247 | 3/1989 | Malady et al. | 364/717 |
| 4,819,818 | 4/1989 | Simkus et al. | 273/138 |

*Primary Examiner*—Donald J. Yusko
*Assistant Examiner*—Dervis Magistre
*Attorney, Agent, or Firm*—Harold M. Dixon; William R. Moser; Richard E. Constant

[57] ABSTRACT

An apparatus for selecting at random one item of N items on the average comprising counter and reset elements for counting repeatedly between zero and N, a number selected by the user, a circuit for activating and deactivating the counter, a comparator to determine if the counter stopped at a count of zero, an output to indicate an item has been selected when the count is zero or not selected if the count is not zero. Randomness is provided by having the counter cycle very often while varying the relatively longer duration between activation and deactivation of the count. The passive circuit components of the activating/deactivating circuit and those of the counter are selected for the sensitivity of their response to variations in temperature and other physical characteristics of the environment so that the response time of the circuitry varies. Additionally, the items themselves, which may be people, may vary in shape or the time they press a pushbutton, so that, for example, an ultrasonic beam broken by the item or person passing through it will add to the duration of the count and thus to the randomness of the selection.

20 Claims, 2 Drawing Sheets

RANDOM ONE-OF-N SELECTOR

The U.S. Government has rights in this invention pursuant to Contract No. DE-AC09-89SR18035 between the U.S. Department of Energy and Westinghouse Savannah River Company.

BACKGROUND

1. Field of the Invention

The present invention relates generally to electrical apparatus for making random selections and more particularly to apparatus for making at random one selection on the average in every "N" cases where "N" is an integer having a value greater than one.

2. Discussion of Background

Systems for making random selections are useful in a very wide variety of activities, from games of chance to quality control to security applications, where one token or manufactured item or person on the average out of some number of items is randomly selected. In secure facilities, employees and visitors, selected at random, may be subjected to searches or contraband. It is important that security not be defeated by those seeking to avoid being searched and that inspections of manufactured items be sufficiently random so that a true picture of product quality is presented.

A number of devices exist for generating random numbers or random selections. Many of these are computer-based and some use pseudorandom numbers in making selections. See as examples, the apparatus disclosed by Malady, et al. in U.S. Pat. No. 4,811,247, by Bennison in U.S. Pat. No. 4,580,226 and by Bishop in U.S. Pat. No. 3,961,169. Malady employs a decade counter, a dual 4-bit register, two 16:1 multiplexers and a dual BCD counter to make select/non-select determinations. Bennison stores pseudorandom numbers in a large computer memory. Bishop generates pseudorandom numbers by AND-gating a random series of "1's" and "0's" against a series of clock pulses.

In another approach, Simkus, et al., as described in U.S. Pat. No. 4,819,818, uses counters to cycle quickly through a count, stopping at some number in the range during one of the cycles, to simulate the roll of dice. If two dice are simulated, one counter is stopped on the pressing of a "roll" button and the other counter is stopped on the release of the button.

Many of these devices are unduly complicated, expensive and are unsuitable for environments which are not climate controlled, such as the floor of a manufacturing facility or the entrance to a secure facility. There is a need for a simple, rugged apparatus for selecting, at random and on average, one item out of every N items.

SUMMARY OF THE INVENTION

The present invention is an apparatus for making a decision to select or not to select one item in a series of several items with the outcome of the decision approaching randomness so the chances of each particular item being selected is unpredictable, but, over the course of a large number of decision-making events, one item will be selected from every "N" items where "N" is a number selected by the user. The apparatus is applicable to selecting at random (1) individuals to be searched at an airport or other restricted facility; (2) items in a series of manufactured items to be inspected for defects; (3) the winning tokens in a game of chance; or (4) any other object or sample where one object is selected in N items on the average but with the outcome of each selection being unpredictable.

According to its major aspects, the present invention comprises a means for sensing the presence of each of the items and producing an output signal for each item so sensed. The output signal has a duration, that is, a period of time from the start of the signal to its end. The invention has a means for counting pulses, and preferably a means for generating the pulses it counts, which counting means counts the pulses beginning with a first number, such as zero, up to a reference number, the "N" selected by the user. This counting, from zero to N, defines a counting cycle which also has a duration. The counting cycle duration is preferably very short. Upon reaching N, the counting means is immediately reset to zero to begin a new counting cycle. The counting means is activated by an activating means upon its receipt of the signal that an item has been sensed, counting through cycle after cycle until the activating means deactivates the counting means. The activating means also has a duration. The total time of the durations of the signal means and the activating means is much longer than the counting cycle duration, preferably at least five times longer, more preferably at least ten times longer, and most preferably hundreds of times longer.

When the counting means is deactivated by the activating means, its count will be somewhere between zero and N-1, inclusive. That count is compared to zero. If the count is equal to zero, the apparatus will indicate that the sensed item has been selected. If the count is not equal to zero, the apparatus will indicate the item is not selected.

In a preferred embodiment, the apparatus is made of a number of electrical circuit components whose response changes or varies with time, temperature or other physical characteristics. Additionally and alternatively, the items themselves may have physical characteristics that vary from item to item enough to cause variations in the duration in the signal. The apparatus also will preferably have a means for blocking the activating means if a sensed item is indicated as selected in order to give the user an opportunity to respond before the counting means can again be activated for the next decision.

A feature of the present invention is the use of a counting means, such as binary counter, in combination with variations in the response of circuit components to generate a randomness. This feature has the advantage of making the apparatus very simple in design, compact, and low in cost. Also, because several components will all vary in their response, the possibility of systematic errors that might otherwise result in nonrandomness and predictability is reduced.

Because the apparatus may be embodied in CMOS logic elements, it has the further advangages of having low power requirements and being manufacturable as a single integrated circuit chip or hybrid assembly with only a few external passive components for improved ruggedness and low cost.

These and other features and advantages of the present invention will be apparent to someone skilled in the art of selection devices from a careful review of the following detailed description and drawings.

DETAILED DESCRIPTION OF A PREFERRED EMBODIMENT

The present invention is an apparatus for making selections of one item on the average in N items, where N is a number chosen by the user and where the outcome of any particular consideration of an item is unpredictable or random. The items can be people, nonuniform objects such as pieces of luggage, or uniform objects such as manufactured goods on a conveyor belt or assembly line.

Figure 1:
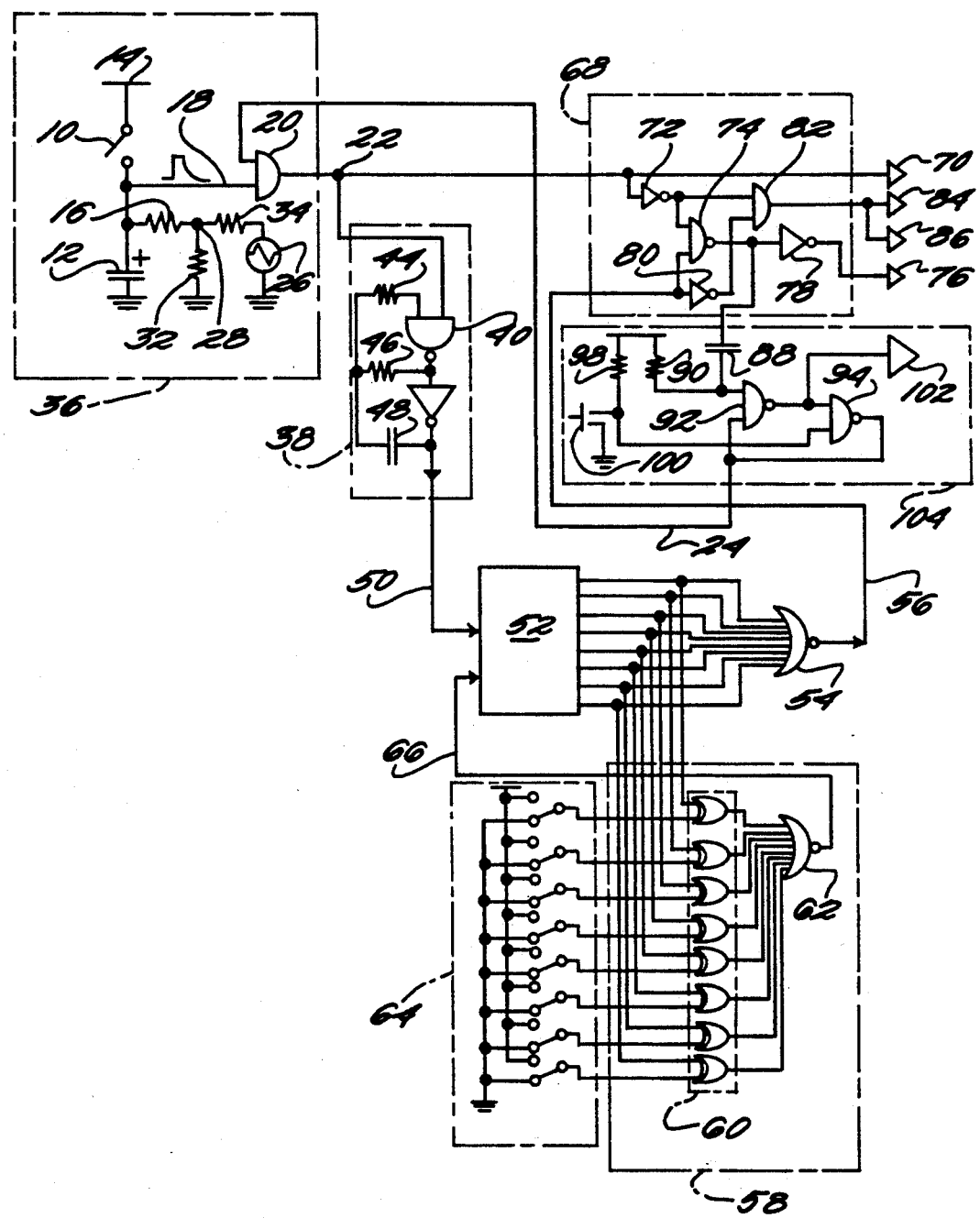
FIG. 1 is a circuit diagram according to a preferred embodiment of the present invention.

The apparatus of the present invention is preferably embodied in electronic circuitry as illustrated in FIG. 1 and which will be described presently. Briefly, the apparatus contains a timing circuit which accepts a start from a pushbutton, electric eye, ultrasonic device or other means for sensing the presence of an item. The timing circuit activates an oscillator that generates a series of pulses that increment a counting means such as a binary counter from zero to N. A resetting means resets the counter to zero when it reaches the number N so that it counts through the counting cycle again and again. As long as the pushbutton is depressed or the light beam of the electric eye remains broken, the binary counter will count oscillator pulses, cycling repeatedly from zero to N. When the pushbutton is released or the light beam restored, the counter is deactivated and the number it has counted to is then compared to zero. If equal to zero, the item is selected; if not equal to zero, it is not selected.

The sum of the duration of time the pushbutton is depressed or the beam broken, plus a duration of time thereafter resulting from the response of the circuit components, will vary from one item to the next. Advantage is taken of variations in the response of those components to certain physical characteristics to add further to the uncertainty in the duration of the activation of the binary counter, and thus the number the binary counter reaches when it finally stops. Furthermore, the time for the binary counter to count through a cycle is short compared to this sum so that the counter cycles at least five times and preferably many more before being stopped and the number the binary counter reaches when stopped is therefore essentially unpredictable and random.

Referring now to FIG. 1, momentary switch 10, when closed, allows capacitor 12 to be charged by D.C. supply line 14, which also powers all logic components in the prototype. Switch 10 may be a pushbutton, foot switch, electric eye or other device, as appropriate for the application.

A full charge of capacitor 12 is attained in a small fraction of a second, and maintained so long as switch 10 remains closed. This charge then bleeds off through a resistor 16, causing a roughly exponential decay in the voltage across capacitor 12. A voltage comparator 20 monitors this voltage via input 18 and generates a "true" output on signal line 22 so long as the voltage at 18 is greater than one-half the supply voltage at 14. Comparator 20 is preferably a CMOS logic AND gate, as shown, or a combination of gates serving the same function, with the voltage across capacitor 16 applied to one input 18, while the other input 24 acts to enable or disable a "true" output from comparator 20 in a manner to be described presently. (As is the convention a "high" output is also referred to as a "true" or "one" output; and a "low" output, as a "false" or "zero" output.)

So that the rate of decay (and hence the "true" time period) will be more difficult to predict, capacitor 12 is a type having a large temperature coefficient. Resistor 16 may also be sensitive to temperature, that is, have a resistance that varies with temperature, such as a thermistor. Resistor 16 may be tied directly to ground, but is preferably connected to a voltage source 26 whose output varies with time so that the voltage decay time will be still more difficult to predict. Source 26 might, for instance, be a sine-wave or triangle-wave generator whose time cycle is long compared with the RC time constant set by resistor 16 and capacitor 12.

In no case should the output of source 26 act to raise the voltage at 18 above the threshold of comparator 20 once that voltage has decayed to a value below that threshold. Hence, the voltage at 28 seen by resistor 16 should at all times be less than this value. If the output of source 26 could exceed this level resistor 16 may, for instance, be connected to source 26 through a voltage divider formed by resistors 32 and 34 as shown.

Capacitor 12, resistors 16, source 26, comparator 20 and resistors 32 and 34, if used, represent a timing circuit 36. The output of comparator 20 at 22 controls an oscillator 38 which is preferably a square-wave generator, consisting, for example, of a CMOS NAND gate 40 and inverter 42, two resistors 44 and 46, and a capacitor 48, and producing an output at line 50. The working frequency of such an oscillator is roughly given by the equation:

$$f = 1/(2.3RC)$$

where R is the value of resistor 46, the value of resistor 44 is several times larger than the value of resistor 46 and C is the value of capacitor 48. This frequency should be sufficiently high that several hundred or preferably several thousand pulses are generated during the time when the output of comparator 20 is "true" and oscillator 38 is enabled. Note that capacitor 48 must be a nonpolarized type for oscillator 38 to work reliably.

Any or all of the passive components of oscillator 38 may be chosen to have large temperature coefficients, so that the oscillation frequency varies with temperature and the difficulty of predicting the selector's outcome is further increased. This is most easily done by making capacitor 48 a highly temperature-sensitive type. However, it should not be the same type of capacitor as capacitor 12, nor have a similar temperature coefficient. Ideally, the two capacitors, 12 and 48, should have coefficients that vary in opposite directions over most of the temperature range of the anticipated environment of use, maximizing the variation in the number of pulses while comparator 20 is "true". For instance, capacitor 12 could be a small aluminum electrolytic type and capacitor 48 a monolythic ceramic unit having a "Z5U" or similar temperature response.

The output of oscillator 38 on line 50 drives a binary counter 52, such as a CD4040, having eight or more parallel outputs, an input from oscillator 38 and a reset (zeroing) input 66. Two digital comparators are connected to the outputs of this counter. These can be formed by diode-resistor "AND" and "OR" gates, but would preferably be made up of CMOS logic gates as described below.

First comparator 54 is formed by a simple, eight-input NOR gate such as a CD4078, responding with an output of logic "1" on signal line 56 when all eight inputs (and thus the count) are zero. Second comparator 58 is made up of a set 60 of eight XOR (exclusive-or) gates, such as two CD4070 packages, followed by an eight input NOR gate 62. One input of each of the XOR gates is fed by an output from counter 52; the other input of each gate is fed from one switch of an eight switch array 64. Each switch of array 64 may be set manually to send either a logic "1" or a logic "zero" to the corresponding XOR gate; the combination of all eight switch settings represents "N" in binary notation. Each XOR gate in array 60 produces a logic "zero" if the two inputs match (one from the output of counter 52 and one from switch array 64), and thus, when the count matches "N" as set using switches 64, all eight XOR gates of set 60 produce zeros. NOR gate 62, accepting these as inputs, therefore, produces a logic "one" output only when the count equals "N". This logic "one" is fed back to counter 52 on reset input line 66, returning the count immediately to zero. As a result, counter 52 cycles repeatedly through a cycle of "N" stages, representing counts from zero to "N-1".

Signal 22 from timing circuit 36 (held at logic "one" while the counter runs) and signal 56 from the first comparator (at logic "one" when the count is zero) are sent to a logic gate array 68 which performs various Boolean and latching functions, as described below.

Signal 22 is fed directly to output buffer 70, which may, for example, turn on an array of amber LED's (not shown) illuminating a legend such as "RUNNING" while counter 38 is enabled.

An inverter gate 72 also inverts signal 22, producing a logic "zero" while the counter runs. NAND gate 74 combines inverted signal 22 with signal 56, producing a logic "zero" when the counter is stopped on a count of zero. This signal is fed to output buffer 76 through inverter 78, so that the output is "true" when the counter is stopped on zero. This output may, for example, turn on an array of red LED's (not shown) illuminating the legend "STOP FOR INSPECTION".

Similarly, inverter 80 inverts signal 56, and AND gate 82 acts on this and the inverted signal 22, giving a "true" output when the counter is stopped on a count other than zero. Gate 82 drives an output buffer or, preferably, two separate buffers 84 and 86. Typically, one of these buffers might trigger an audible output device, such as the Mallory Sonalert SC-616CP, which produces a pleasing, short-lived chime, while the other might turn on an array of green LED's (not shown) illuminating the legend "PASS—O.K.". The use of dual buffers accomodates loads with differing drive requirements.

Gate 74's output is also coupled, by means of capacitor 88 and pull-up resistor 90, to one input of a NAND gate 92 in such a way that a falling transition of gate 74 generates a brief logic "low" pulse at one input of NAND gate 92. This gate is interconnected with another NAND gate 94 in such a way as to form a bistable latch 104 which is set by the pulse applied to NAND gate 92 and reset by a similar pulse applied to NAND gate 94. The "reset" pulse is generated manually; for instance, by means of a pull-up resistor 98 and grounding pushbutton 100. Both pull-up resistors are connected to positive supply line 14.

The output of NAND gate 92 is connected to output buffer 102, which, whenever latch 104 is set, may drive an auxiliary output device. In a security application, this is preferably a harsh-sounding buzzer which gives additional warning to a person selected to be searched. This output is cancelled when the latch is reset by pushbutton 100, whereas the primary output from buffer 76 (driving, for instance, the red "STOP FOR INSPECTION" message LED illumination) persists until the random selection process is started again by closing switch 10.

A premature restart of the random process is prevented by connecting the output of gate 94 back through line 24 to the second input of gate 20. Since this line in held low while the latch is set, it prevents gate 20 from generating a "true" output regardless of the voltage on capacitor 12, and thus prevents further closures of switch 10 from restarting the counter or having any other effect until the latch is reset manually.

Figure 2:
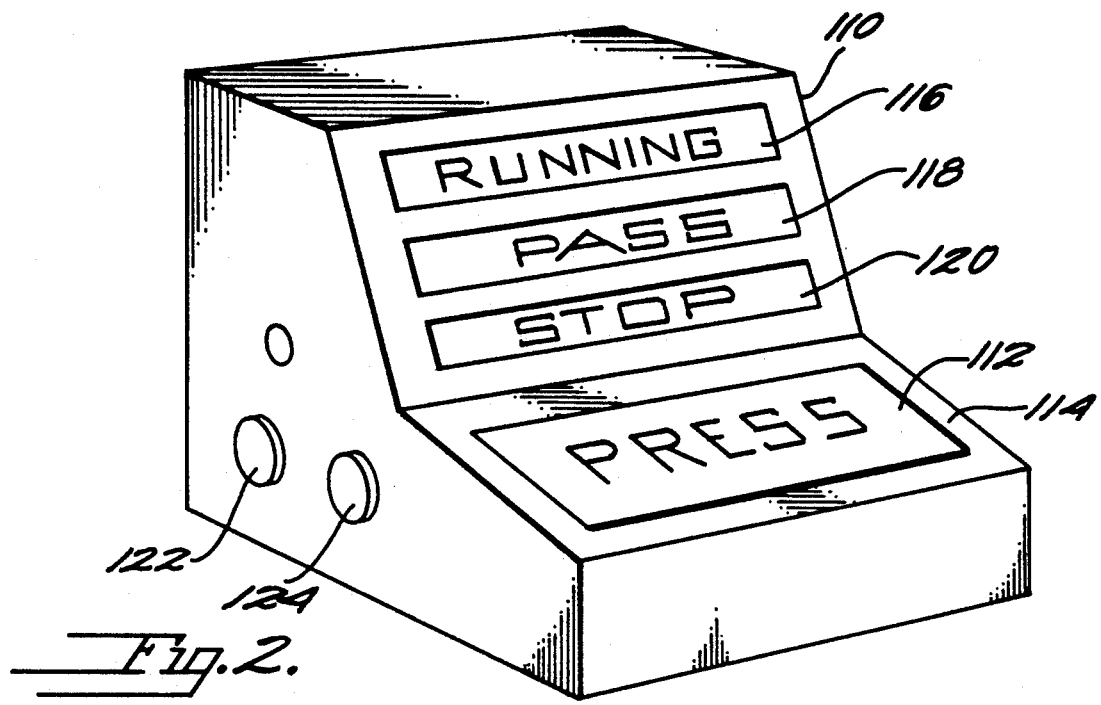
FIG. 2 is a perspective view of the exterior of an apparatus according to a preferred embodiment of the present invention.
Figure 3:
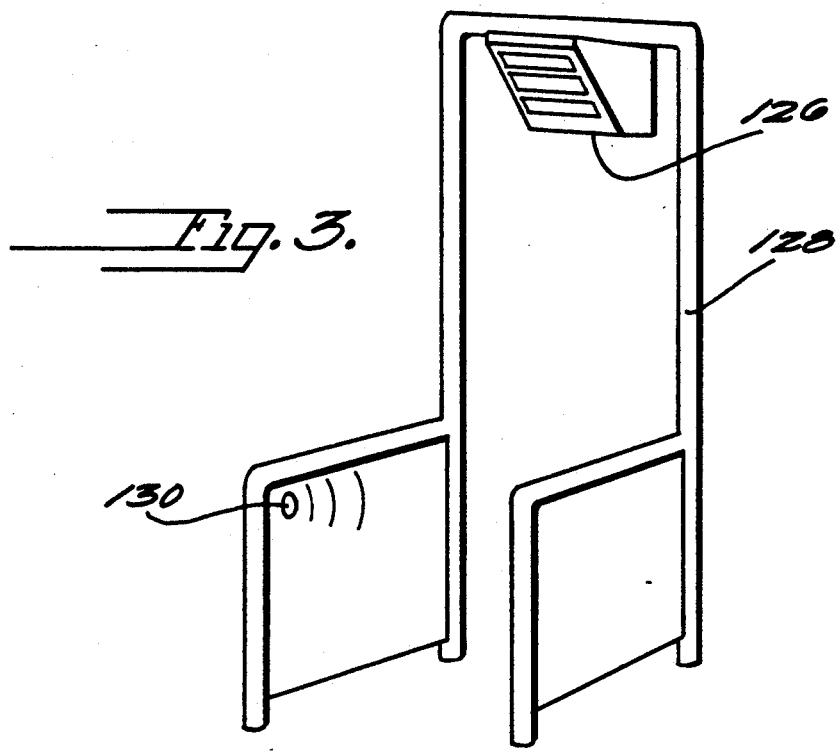
FIG. 3 is a perspective view of the exterior of an apparatus according to an alternative embodiment of the present invention.

In a security application, the invention would normally be housed in a compact, weather-proof housing 110, as shown in FIG. 2, having a heavy-duty pushbutton or pressure-sensitive panel 112 on a sloping front 114, three lamps or illuminated message panels 116, 118, and 120 located above the pushbutton, two sound-producing devices 122 and 124 preferably located on a vertical face, and a pushbutton or preferably a simple, multiple-pushbutton combination lock (not shown) located on the rear. Pushbutton 112 corresponds to switch 10 in FIG. 1, panels 116, 118, and 120 correspond to the output devices run by drivers 70, 76, and 84; and devices 122 and 124 correspond to the audible outputs controlled by drivers 86 and 102, and the rear-panel button or lock to the reset device 100.

In addition to being set on a tabletop or a pedestal, an apparatus 126 according to the present invention might be attached to a portal 128 through which entering or leaving persons would pass. In the case of portal 126, pushbutton 112 (of FIG. 2) would preferably be replaced by an infrared or ultrasonic beam 130 which, when broken, would close a set of contacts corresponding to switch 10 to thus start the randomizing process.

On activation of the invention, the amber "RUNNING" legend would be displayed for approximately one second. At the end of this time, if the final count took a nonzero value, the green "PASS—O.K." message would be lighted and the chime would sound. If the final count were zero, the red "STOP FOR INSPECTION" legend would be lighted instead, and the buzzer would sound. Further pressing of the button (or breaking the light beam) would have no effect until a guard arrived to reset circuit and conduct the necessary search. The use of a combination lock for the reset switch would help to prevent unauthorized resets. When reset by the guard, the buzzer would cease to sound and the device would become available to the next person desiring to enter. It will be apparent that many changes can be made to the specific details of the foregoing embodiment without departing from the spirit of the invention which is defined by the following claims.

What is claimed is:
1. An apparatus for making a decision to select one item from several items, said apparatus comprising:
 means for generating pulses
 means for sensing the presence of each of said items and producing an output signal thereupon, said output signal having a first duration;

means for counting pulses, said counting means in electrical connection with said generating means, said counting means counting pulses from a first number up to a reference number thereby defining a counting cycle, said counting cycle having a second duration;

means in electrical connection with said counting means for resetting said counting means after each of said counting cycles whereby said counting means can begin another counting cycle;

means for activating said counting means upon receipt of said output signal, said counting means activated for a third duration, said counting means responsive to said activating means and in operational connection with said sensing means for receipt of said output signal, said counting means having a count when deactivated, and wherein the sum of said first and said third duration is at least five times longer than said second duration;

means in electrical connection with said counting means for comparing said count of said counting means to said first number; and means in electrical connection with said comparing means for indicating said item is selected when said count and said first number are equal.

2. The apparatus as recited in claim 1, further comprising means for generating said series of pulses.

3. The apparatus as recited in claim 2, wherein said generating means is sensitive to changes in the temperature of the environment of said apparatus so that said generating means generates said series of pulses at different rates depending on the temperature.

4. The apparatus as recited in claim 1, further comprising means for varying said third duration.

5. The apparatus as recited in claim 1, further comprising means for selecting said reference number.

6. The apparatus as recited in claim 1, further comprising means for blocking said activating means following selection of an item.

7. The apparatus as recited in claim 1, wherein the sum of said first and said third duration is at least ten times longer than said second duration.

8. The apparatus as recited in claim 1, wherein said third duration is at least five times longer than said second duration.

9. An apparatus for making a decision to select one item from several items, each of said items initiating a signal having a first duration, said apparatus comprising:

means for generating pulses;

means for counting pulses, said counting means in electrical connection with said generating means, said counting means counting pulses from a first number up to a reference number thereby defining a counting cycle, said counting cycle having a second duration;

means in electrical connection with said counting means for resetting said counting means after each of said counting cycles whereby said counting means can begin another counting cycle;

means for activating said counting means upon receipt of said output signal, said counting means activated for a third duration, said counting means responsive to said activating means and in operational connection with said sensing means for receipt of said output signal, said counting means having a count when deactivated, and wherein the sum of said first and said third duration is at least five times longer than said second duration;

means in electrical connection with said counting means for comparing said count of said counting means to said first number; and means in electrical connection with said comparing means for indicating said item is selected when said count and said first number are equal.

10. The apparatus as recited in claim 9, further comprising means for generating said series of pulses.

11. The apparatus as recited in claim 10, wherein said generating means is sensitive to changes in the temperature of the environment of said apparatus so that said generating means generates said series of pulses at different rates depending on the temperature.

12. The apparatus as recited in claim 9, further comprising means for varying said third duration.

13. The apparatus as recited in claim 9, further comprising means for selecting said reference number.

14. The apparatus as recited in claim 9, further comprising means for blocking said activating means following selection of an item.

15. The apparatus as recited in claim 9, wherein the sum of said first and said third duration is at least ten times longer than said second duration.

16. The apparatus as recited in claim 9, wherein said third duration is at least five times longer than said second duration.

17. A method for making a selection of an item from several items comprising the steps of:

recognizing separately a first item of said several items;

establishing a first duration of time equal to the length of time required to recognize said first item;

starting a clock for said first duration of time;

repeatedly counting from a first number to a reference number when said clock is started, each counting from said first number to said reference number defining a counting cycle, each counting cycle having a second duration of time, said first duration of time being at least five time longer than said second duration of time;

stopping said clock at a count when said first duration of time ends;

comparing said count at the end of said first duration of time to said first number;

designating said item as a selected item if said count equals said first number; and designating said item as a nonselected item if said count does not equal said first number.

18. The method as recited in claim 17, wherein said first duration of time is established by a characteristic of said several items, said characteristic varying from item to item.

19. The method as recited in claim 17, further comprising the step of varying the rate of counting.

20. The method as recited in claim 19, wherein said rate of counting varies with temperature of the environment.

* * * * *